US006848084B1

United States Patent
Pandey et al.

(10) Patent No.: US 6,848,084 B1
(45) Date of Patent: Jan. 25, 2005

(54) METHOD AND APPARATUS FOR VERIFICATION OF MEMORIES AT MULTIPLE ABSTRACTION LEVELS

(75) Inventors: Manish Pandey, San Jose, CA (US); Mitchell W. Hines, San Jose, CA (US); Chih-Chang Lin, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/327,608

(22) Filed: Dec. 20, 2002

Related U.S. Application Data

(60) Provisional application No. 60/393,623, filed on Jul. 2, 2002.

(51) Int. Cl.[7] .............................................. G06F 17/50
(52) U.S. Cl. .................................. 716/1; 716/3; 716/4
(58) Field of Search ............................. 716/1–4, 6–14, 716/2–5, 18; 714/718, 721; 703/13–17

(56) References Cited

U.S. PATENT DOCUMENTS

| | | | | |
|---|---|---|---|---|
| 5,377,122 A | * | 12/1994 | Werner et al. ................. | 716/18 |
| 5,493,508 A | * | 2/1996 | Dangelo et al. ............... | 716/5 |
| 5,553,002 A | * | 9/1996 | Dangelo et al. .............. | 716/11 |
| 6,026,226 A | * | 2/2000 | Heile et al. .................... | 716/12 |
| 6,052,524 A | * | 4/2000 | Pauna .......................... | 703/22 |
| 6,053,947 A | * | 4/2000 | Parson ......................... | 703/14 |
| 6,053,948 A | * | 4/2000 | Vaidyanathan et al. ....... | 703/14 |
| 6,249,901 B1 | * | 6/2001 | Yuan et al. ..................... | 716/5 |
| 6,295,627 B1 | * | 9/2001 | Gowni et al. .................. | 716/1 |
| 6,324,678 B1 | * | 11/2001 | Dangelo et al. .............. | 716/18 |
| 6,360,356 B1 | * | 3/2002 | Eng ............................. | 716/18 |
| 6,446,243 B1 | | 9/2002 | Huang et al. | |
| 6,470,478 B1 | * | 10/2002 | Bargh et al. .................... | 716/4 |
| 6,490,717 B1 | * | 12/2002 | Pedersen et al. .............. | 716/18 |
| 6,505,328 B1 | * | 1/2003 | Van Ginneken et al. ........ | 716/7 |
| 6,601,024 B1 | * | 7/2003 | Chonnad et al. .............. | 703/14 |
| 2003/0005418 A1 | * | 1/2003 | Sridhar et al. .............. | 717/140 |
| 2003/0107595 A1 | * | 6/2003 | Ciolfi ........................ | 345/762 |

OTHER PUBLICATIONS

Ludden, J.M. et al., "Functional verification of the POWER4 microprocessor and POWER4 multiprocessor systems", *IBM J. Res. & Dev.*, vol. 46, No. 1, Jan. 2002, pp. 53–76.

Malley, Charles H. et al., "Logic Verification Methodology for PowerPC™ Microprocessors". *32nd Design Automation Conference, ACM/IEEE*, 1995, pp. 234–240.

Weste, Neil H.E., Principles of CMOS VLSI Design A Systems Perspective, 2nd ed., *Addison–Wesley Publishing Company*, Oct. 1994.

* cited by examiner

Primary Examiner—Leigh M. Garbowski
Assistant Examiner—Magid Y. Dimyan
(74) Attorney, Agent, or Firm—Bingham McCutchen LLP

(57) ABSTRACT

This invention relates to method and apparatus for verification of circuit designs containing memories. At a register transfer abstraction level, verification of a circuit design requires showing that the register transfer language (RTL) abstraction of the design is logically equivalent to the design implementation represented at the logic (e.g., gate and/or flip-flop) and/or the transistor (e.g. implementation verification) abstraction levels, as well as logic simulation of the design RTL embedded in a system-level test bench for verification at the system-abstraction level.

66 Claims, 4 Drawing Sheets

METHOD AND APPARATUS FOR VERIFICATION OF MEMORIES AT MULTIPLE ABSTRACTION LEVELS

CROSS REFERENCE TO RELATED APPLICATION

This application claims benefit of U.S. Provisional Patent Application No. 60/393,623, filed Jul. 2, 2002, and is hereby incorporated herein by reference

BACKGROUND OF INVENTION

1. Field of Invention

This invention is related to computer-aided design (CAD) logic verification tools, and more specifically to enabling a methodology which allows verification of circuit designs containing memories at multiple abstraction levels. For example, both equivalency checking and system-level verification can be performed efficiently.

2. Background of Invention

Verification of digital circuit designs such as microprocessors, application specific integrated circuits (ASICs), and system-on-a-chip (SOC) designs, conventionally involves two major steps termed as implementation verification and system-level verification.

The goal of implementation verification is to show that a register transfer language (RTL) abstraction of the design is logically equivalent to a low-level design implementation that is represented at the gate-level or the transistor-level (FIG. 1). The task of determining logic equivalence verifies that the RTL abstraction and the low-level designs implement equivalent finite state machines. This task is generally performed today by using formal equivalence checkers, and requires a methodology where RTL abstraction and the design implementations have similar state machine encoding, and/or design hierarchy.

The goal of system-level verification is to verify the high-level operations the design has to perform, and the overall functionality of the design in context of the system in which it is used. This task is performed by logic simulation of the design RTL in a system-level testbench (FIG. 1).

Today, modern digital systems contain multiple embedded memories of increasing size and complexity which make the tasks of implementation and system-level verification difficult and increases the risks of functional failures in the design. The basic reason for this verification difficulty is that implementation verification via a formal equivalence checker requires that the embedded memories in the RTL have a structure which closely follows that of the low-level design implementation, e.g., both RTL and design implementations should have identical memory cell row-column organization. Furthermore, some circuit behavior cannot be easily described at the RTL-level and may require extensive transistor/logic remodeling in the low-level implementation.

So, to make equivalence checking of embedded memories possible, one may with some effort create an RTL memory model which matches the implementation structure and models its circuit behavior. Unfortunately, such a detailed model is very expensive to simulate as compared to a conventional RTL memory model which does not describe detailed internal memory structure. A need exists for an efficient verification of memory at multiple abstraction levels.

SUMMARY OF INVENTION

Some embodiments of the invention enable efficient verification of memory at multiple abstraction levels.

Some embodiments of the invention enable efficient implementation verification and system-level verification with a library of parameterized memory models and a verification methodology with design RTL instantiating these parameterized memory models. The parameterized models can contain specific parameters describing memory structural and/or circuit characteristics.

Specifying suitable parameter values corresponding to the implementation structure yields a structural model of the RTL memory block that is structurally similar to the memory design implementation. This allows state point mapping between the structural model and the design implementation, and therefore equivalence checking of the RTL memory block against the gate-level or the transistor-level memory. These parameters can also be used to generate a simulation model of the memory block equivalent to the structural model. This simulation model, which can be simulated more efficiently than models which are structurally similar to memory implementation, is used for system-level simulation.

Some embodiments of the invention have a parameterized memory models library with simulation and structural models, and a verification methodology with design RTL instantiating these parameterized memory models.

DETAILED DESCRIPTION OF THE INVENTION

Figure 1:
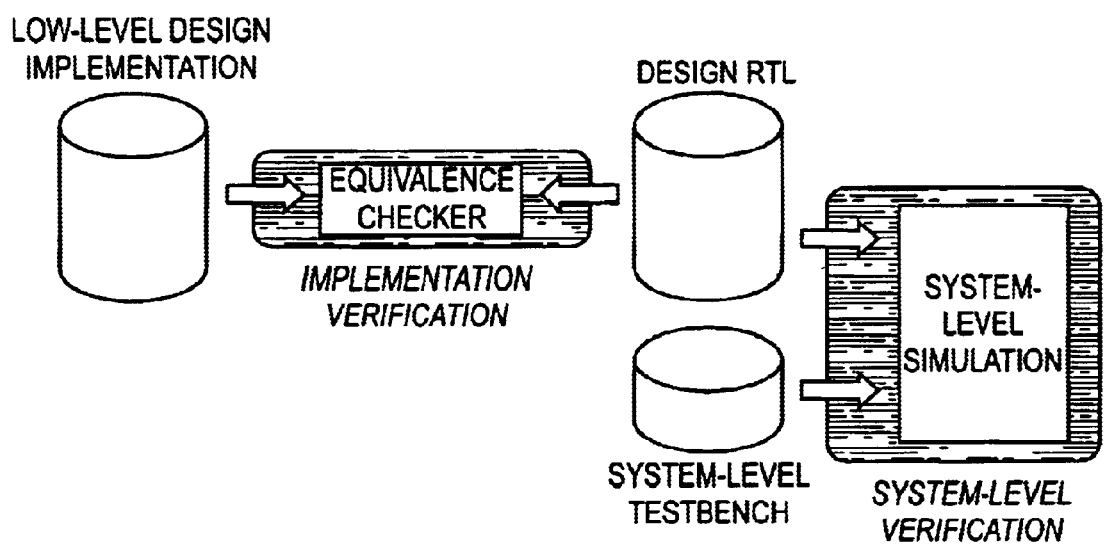
FIG. 1 illustrates the methodology of implementation verification and system-level verification of a digital circuit design.

This invention relates to method and apparatus for verification of circuit designs containing memories. At a register transfer abstraction level, verification of a circuit design requires showing that the register transfer language (RTL) abstraction of the design is logically equivalent to the design implementation represented at the logic (e.g., gate and/or flip-flop) and/or the transistor (e.g. implementation verification) abstraction levels, as well as logic simulation of the design RTL embedded in a system-level test bench for verification at the system-abstraction level. Some embodiments of the invention enable efficient implementation verification and system-level verification with a library of parameterized memory models and a verification methodology with design RTL instantiating these parameterized memory models. The parameterized models contain specific parameters describing memory structural and/or circuit characteristics. Structural characteristics can include structural design aspects such as memory word size, memory word count, and/or column multiplexing ratio. Circuit characteristics can include circuit logic aspects such as bit-line driver logic circuitry. A parameterized memory model instance with specified parameters generates two models—a structural model and a simulation model. Specifying suitable parameter values corresponding to the implementation structure yields a structural model of the RTL memory block that is structurally similar to the memory design implementation. This allows state point mapping between the structural model and the design implementation, and therefore equivalence checking of the RTL memory block against the gate-level or the transistor-level memory. These parameters are also used to generate a simulation model of the memory block equivalent to the structural model. This simulation model, which can be simulated more efficiently than the structural model, is used for system-level simulation. This method enables both implementation verification and efficient system-level verification for digital circuit designs containing embedded memories. The verification techniques described are general, and apply to all hardware description languages which allow both design descriptions at the behavioral and/or structural abstraction levels, including Verilog and VHDL.

Circuit designs exist at multiple levels of abstraction. The more abstract a circuit design, the more appropriate for "simulation" the description of the circuit design becomes. The less abstract the circuit design, the more "structural" the circuit design becomes. From the most abstract to the least abstract, some examples of abstraction levels of circuit design are: system level, register transfer level, logic level (e.g., gates and/or flip-flops), and transistor level.

Some embodiments of the invention enable efficient implementation verification 202 of a low level design implementation 206 with an equivalence checker 207, and system-level verification 204 with a system level testbench 280 and a library of parameterized memory models and a verification methodology with design RTL instantiating these parameterized memory models. The verification technique includes a memory compiler (FIG. 2), labeled Conformal-MEM memory compiler 210. This compiler 210 takes as input an RTL design 220. For every parameterized memory model instance 230 it generates a simulation model 240, contained in Simulation RTL 250 in FIG. 2, and a structural model 260, contained in Formal Verification RTL 270. In various embodiments, the compiler generates a simulation model and/or a structural model at other abstraction levels. In other embodiments, the compiler can be split into multiple compilers. In other embodiments, models can be part of the compiler. In many embodiments, compilers process a more abstract description into a less abstract description.

The simulation model can include at least one Verilog register transfer level design description. The simulation model may handle address collisions for simultaneous writes to a same address at different ports. The simulation model may handle the X ternary value at primary inputs. The simulation model can include Verilog source text for the corresponding memory.

A structural model represents a design view for equivalency checking. This design view, which represents a logic structure, can be represented by either a hierarchical data structure representing design hierarchy and logic details of design modules, and/or it can include Verilog source text for a model that can be synthesized into a logic netlist suitable for equivalence checking.

Figure 2:
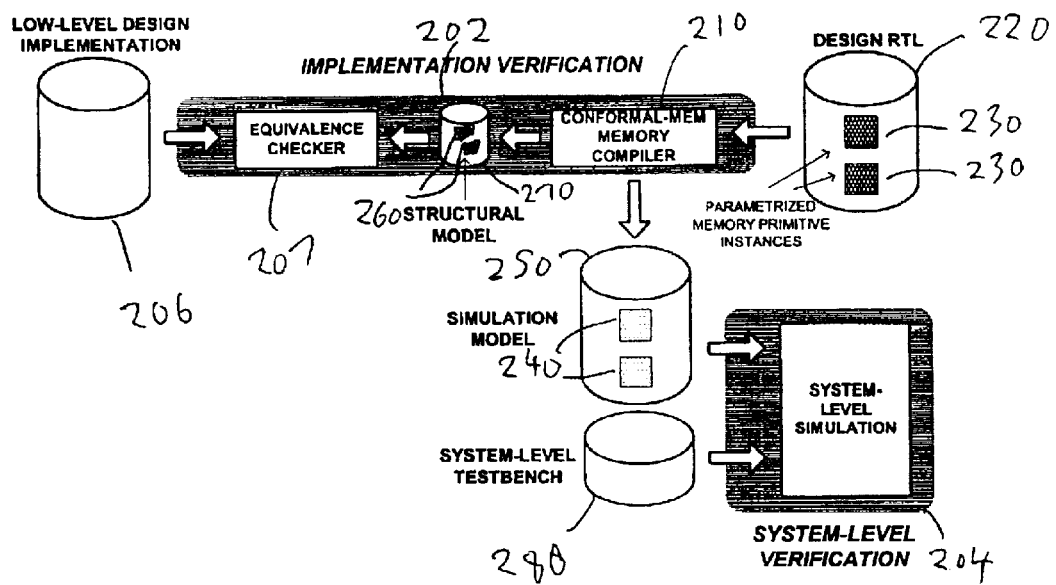
FIG. 2 illustrates the methodology of implementation and system-level verification where a simulation model and a structural model are used for system-level verification and implementation verification respectively.

There are a number of different types of memory primitives that the memory compiler of FIG. 2 handles. These primitives span from single read/write port to multi-read/write port designs, as well as content addressable memories. Table 1 contains a partial list of memory primitives handled by the Memory compiler. Other embodiments can handle fewer, different, and/or more primitives.

TABLE 1

List of parameterized memory models

| NAME | CONFIGURATION |
|---|---|
| VRAM_1P_1RW_1 | 1 shared read/write port |
| VRAM_2P_2RW_1 | 2 shared read/write ports |
| VRAM_2P_1R1W_1 | 1 read, 1 write independent port |
| VRAM_3P_2R1W_1 | 2 read, 1 write independent port |
| VRAM_3P_1R2W_1 | 1 read, 2 write independent port |
| VRAM_4P_2R2W_1 | 2 read, 2 write independent port |
| VRAM_2P_1RW1R_1 | 1 shared read/write, 1 read port |
| VRAM_2P_1RW1W_1 | 1 shared read/write, 1 write port |
| VCAM_2P_1R1W_1 | 1 read 1 write and a lookup CAM block |

The parameterized memory models contain specific parameters describing memory structural and/or circuit characteristics. The simplest parameters are for defining the storage capacity of a memory, in terms of number of words in the memory, and the number of bits in a work.

Two fundamental parameters for a memory are the number of addressable locations in the memory, and the number of bits in each location of the memory. These two are specified by the parameters addrsize and wordsize. To specify a memory instance with 16 words of 4 bits each, one read port and an independent write port one instantiates the VRAM_2P_1R1W_1 primitive in the RTL as follows:

VRAM_2P_1R1W_1 I0(.wadd_clk(..), .radd_clk( ... ) ... );

defparam I0.addrsize=16;

defparam I0.wordsize=4;

The two parameters above allow instance to be a memory of the desired size. At the implementation level, this 16×4 memory can be created with different memory cell organizations, including an 8×8 memory core, a 16×4 memory core or a 4×16 memory core. Depending on the actual memory organization in the implementation, say an 8×8 memory cell core, one can specify additional parameters for this structural information. In other embodiments, a single value can be mapped to a particular combination of the number of addressable locations in the memory, and the number of bits in each location of the memory. In other embodiments, the number of addressable locations in the memory, and/or the number of bits in each location of the memory can be automatically decided without parameters.

The parameter colmux specifies that column mux is a 'colmux' to 1 multiplexer. For the 8×8 core organization the following parameter value can be set.

defparam I0.colmux=2;

Specifying the above three parameter values suitably yields a structural model of the RTL memory block which is structurally similar to the memory design implementation. This allows state point mapping between the structural model and the design implementation, and therefore makes possible equivalence checking of the RTL memory block against the gate-level or the transistor-level memory. The structural model created by the compiler is in terms of standard HDL primitives and closely follows the memory structure and organization of traditional CMOS static random access memories.

Figure 3:
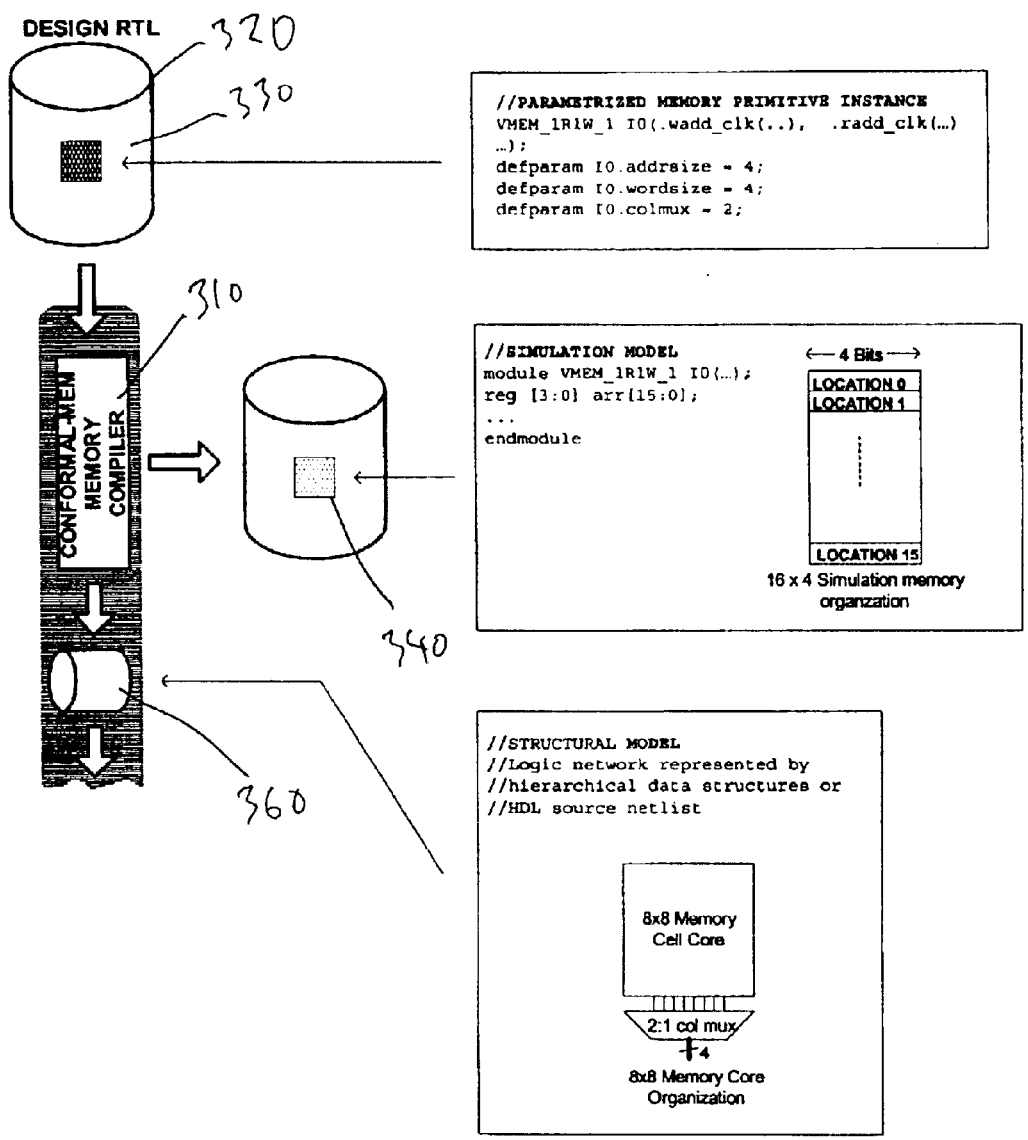
FIG. 3 illustrates an example of generation of simulation and structural model from a design RTL containing parameterized memory primitive instance.

FIG. 3 illustrates an example. Design RTL 320 includes a memory model 330, in this case a 16×4 memory. The compiler 310 creates the simulation model 340 containing a 16×4 simple memory. In the figure, since colmux has been specified as 2, wordsize is 4, and wordcount is 16, a 8×8 memory core is created, with a 2:1 column multiplexer. The compiler 310 also creates a structural model 360.

Parameters can also be used to model additional memory behavior variations. These include parameters for describing bitline organization (differential or single-ended), write-driver behavior (drives 0 or 1 or Z when no writes). In addition parameters can control whether the memory unit has a set or reset signal and many other structural aspects of the design. There are parameters which can control the generation of simulation model, including detection of write collisions in memories with multiple write ports, and/or modeling and correct handling of memory behavior when one or more inputs are the ternary value X.

The verification techniques described are general, and apply to all industry standard hardware description languages including Verilog and VHDL.

Figure 4:
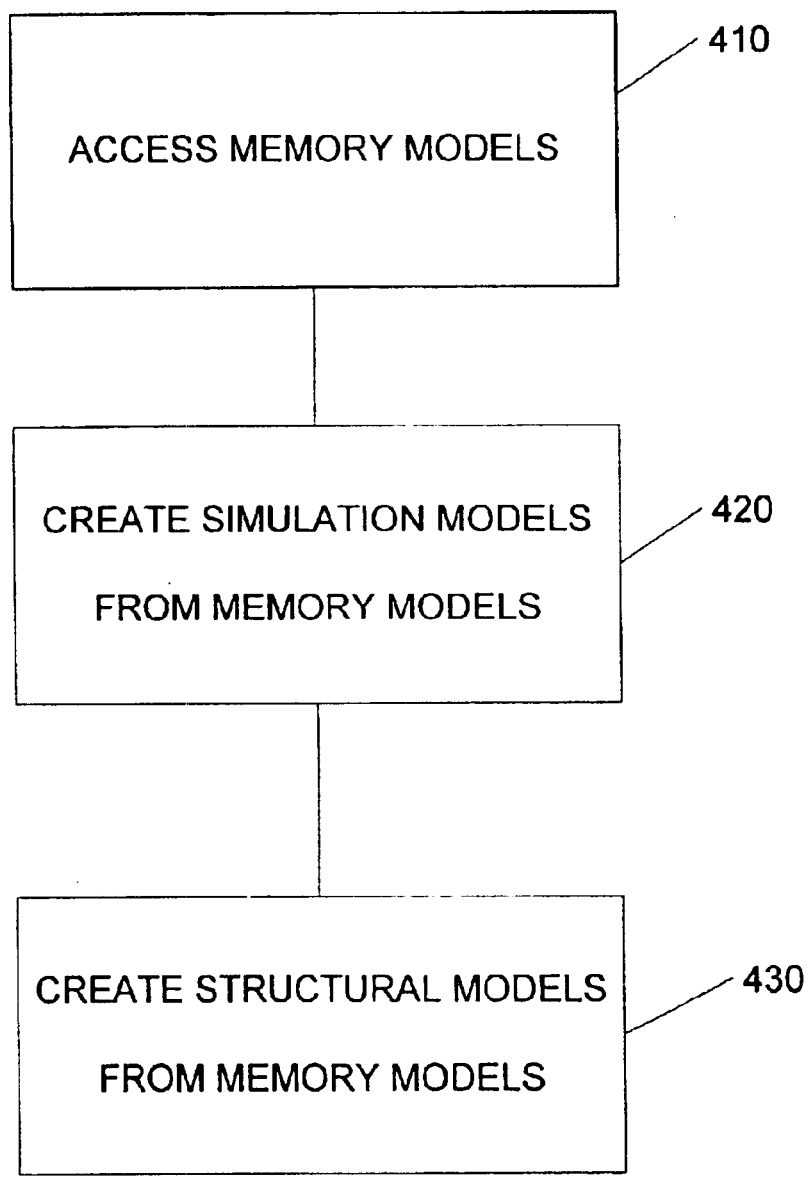
FIG. 4 illustrates a flow diagram of a method embodiment.

FIG. 4 illustrates a simple flowchart for one method embodiment. In 410, one or more memory models is accessed. In 420, a simulation model is created at least partly from the memory models. In 430, a structural model is created at least partly from the memory models. The flowchart can be rearranged, added to, reduced, and/or changed.

Disclosed are some embodiments only. The invention includes modifications, additions, and deletions apparent to those skilled in the art. Incorporated by reference herein are: U.S. Pat. No. 6,446,243; J. M. Ludden, W. Roesner, G. M. Heiling, J. R. Reysa et.al., Functional verification of the POWER 4 microprocessor and POWER 4 multiprocessor systems, IBM Journal of Research and Development, p. 53, Vol. 46, No. 1, 2002; C. H. Malley and M. Dieudonne, Logic verification methodology for PowerPC microprocessors, in proceedings of Design Automation Conference, pp. 234–240, 1995; N. H. Weste, and K. Eshraghian, Principles of CMOS VLSI Design, $2^{nd}$ ed., Addison Wesley Publishing Company, 1994.

What is claimed is:

1. A verification apparatus for use on one or more computers, comprising:
   one or more compilers for processing one or more parameterized memory models of one or more memories;
   one or more simulation models of the one or more memories, wherein at least one of the one or more simulation models is for verification of a first abstraction level circuit design of the one or more memories; and
   one or more structural models of the one or more memories, wherein at least one of the one or more structural models is for verification of a second abstraction level circuit design of the one or more memories,
   wherein the first abstraction level circuit design is more abstract than the second abstraction level circuit design, and both the one or more simulation models and the one or more structural models are created from the one or more parameterized models.

2. The apparatus of claim 1, wherein at least part of the first abstraction level circuit design is at a system level of abstraction.

3. The apparatus of claim 1, wherein at least part of the first abstraction level circuit design is at a register transfer level of abstraction.

4. The apparatus of claim 1, wherein the first abstraction level circuit design is at least as abstract as a register transfer level of abstraction.

5. The apparatus of claim 1, wherein at least part of the second abstraction level circuit design is at a logic level of abstraction.

6. The apparatus of claim 1, wherein at least part of the second abstraction level circuit design is at a transistor level of abstraction.

7. The apparatus of claim 1, wherein the second abstraction level circuit design is no more abstract than a register logic level of abstraction.

8. The apparatus of claim 1, further comprising:
   a system level simulator performing verification of the first abstraction level circuit design of the one or more memories with at least one of the one or more simulation models of the one or more memories.

9. The apparatus of claim 8, wherein the system level simulator includes a hardware description language simulator.

10. The apparatus of claim 8, wherein the system level simulator performs at least formal verification.

11. The apparatus of claim 1, further comprising:
    an equivalence checker performing verification of the second abstraction level circuit design of the one or more memories with at least one of the one or more structural models of the one or more memories.

12. The apparatus of claim 11, wherein the equivalence checker performs verification of the second abstraction level circuit design of the one or more memories with at least one of the one or more structural models of the one or more memories, at least partly with state point mapping between the second abstraction level circuit design of the one or more memories and the at least one of the one or more structural models of the one or more memories.

13. The apparatus of claim 1, wherein each parameterized memory model of the one or more parameterized memory models at least partly models one or more memory primitives.

14. The apparatus of claim 13, wherein at least one of the one or more primitives modeled by at least one of the one or more parameterized memory models includes one or more of: content addressable memories, single read port memories, multi read port memories, single write port memories, multi write port memories.

15. The apparatus of claim 13, wherein at least one of the one or more memory primitives modeled by the one or more parameterized memory models is described by one or more parameters.

16. The apparatus of claim 15, wherein at least one of the one or more parameters at least partly defines: a number of addressable locations, an amount of memory in each of the addressable locations, column multiplexing ratio for a number of physical columns per bit of data, bitline organization, write-driver behavior, set signal, reset signal, detection of write collision, and memory behavior when one or more inputs are ternary value X.

17. The apparatus of claim 1, wherein at least one of the one or more simulation models includes at least hardware description language description.

18. The apparatus of claim 1, wherein at least one of the one or more simulation models handles address collisions for simultaneous writes to a same address at different ports.

19. The apparatus of claim 1, wherein at least one of the one or more simulation models handles the X ternary value at primary inputs.

20. The apparatus of claim 1, wherein the creation of at least one of the one or more simulation models results in the creation of hardware description language source text for the corresponding memory.

21. The apparatus of claim 1, wherein at least one of the one or more structural models includes a hierarchical data structure representing design hierarchy and logic details of design modules in the design hierarchy.

22. The apparatus of claim 1, wherein at least one of the one or more structural models includes hardware description language source text for synthesis into a logic netlist for equivalence checking.

23. A method of verification, comprising:
accessing one or more parameterized memory models of one or more memories;
at least partly from the one or more parameterized memory models, creating one or more simulation models of the one or more memories, wherein at least one of the one or more simulation models is used for verification of a first abstraction level circuit design of the one or more memories; and
at least partly from the one or more parameterized memory models, creating one or more structural models of the one or more memories, wherein at least one of the one or more structural models is used for verification of a second abstraction level circuit design of the one or more memories,
wherein the first abstraction level circuit design is more abstract than the second abstraction level circuit design.

24. The method of claim 23, wherein at least part of the first abstraction level circuit design is at a system level of abstraction.

25. The method of claim 23, wherein at least part of the first abstraction level circuit design is at a register transfer level of abstraction.

26. The method of claim 23, wherein the first abstraction level circuit design is at least as abstract as a register transfer level of abstraction.

27. The method of claim 23, wherein at least part of the second abstraction level circuit design is at a logic level of abstraction.

28. The method of claim 23, wherein at least part of the second abstraction level circuit design is at a transistor level of abstraction.

29. The method of claim 23, wherein the second abstraction level circuit design is no more abstract than a register logic level of abstraction.

30. The method of claim 23, further comprising:
performing verification of the first abstraction level circuit design of the one or more memories with at least one of the one or more simulation models of the one or more memories using a system level simulator.

31. The method of claim 30, wherein the system level simulator performs at least formal verification.

32. The method of claim 23, wherein the system level simulator includes a hardware description language simulator.

33. The method of claim 23, further comprising:
using an equivalence checker to perform verification of the second abstraction level circuit design of the one or more memories with at least one of the one or more structural models of the one or more memories.

34. The method of claim 33, wherein the equivalence checker performs verification of the second abstraction level circuit design of the one or more memories with at least one of the one or more structural models of the one or more memories, at least partly with state point mapping between the second abstraction level circuit design of the one or more memories and the at least one of the one or more structural models of the one or more memories.

35. The method of claim 23, wherein each parameterized memory model of the one or more parameterized memory models at least partly models one or more memory primitives.

36. The method of claim 35, wherein at least one of the one or more primitives modeled by at least one of the one or more memory models includes one or more of: content addressable memories, single read port memories, multi read port memories, single write port memories, multi write port memories.

37. The method of claim 35, wherein at least one of the one or more memory primitives modeled by the one or more memory models is described by one or more parameters.

38. The method of claim 37, wherein at least one of the one or more parameters at least partly defines: a number of addressable locations, an amount of memory in each of the addressable locations, column multiplexing ratio for a number of physical columns per bit of data, bitline organization, write-driver behavior, set signal, reset signal, detection of write collision, and memory behavior when one or more inputs are ternary value X.

39. The method of claim 23, wherein at least one of the one or more simulation models includes at least hardware description language description.

40. The method of claim 23, wherein at least one of the one or more simulation models handles address collisions for simultaneous writes to a same address at different ports.

41. The method of claim 23, wherein at least one of the one or more simulation models handles the X ternary value at primary inputs.

42. The method of claim 23, wherein the creation of at least one of the one or more simulation models results in the creation of hardware description language source text for the corresponding memory.

43. The method of claim 23, wherein at least one of the one or more structural models includes a hierarchical data structure representing design hierarchy and logic details of design modules in the design hierarchy.

44. The method of claim 23, wherein at least one of the one or more structural models includes hardware description language source text for synthesis into a logic netlist for equivalence checking.

45. A verification apparatus, comprising:
means for accessing one or more parameterized memory models of one or more memories;
means for creating, at least partly from the one or more parameterized memory models, one or more simulation models of the one or more memories, wherein at least one of the one or more simulation models is used for verification of a first abstraction level circuit design of the one or more memories; and
means for creating, at least partly from the one or more parameterized memory models, one or more structural models of the one or more memories, wherein at least one of the one or more structural models is used for verification of a second abstraction level circuit design of the one or more memories,
wherein the first abstraction level circuit design is more abstract than the second abstraction level circuit design.

46. The apparatus of claim 45, wherein at least part of the first abstraction level circuit design is at a system level of abstraction.

47. The apparatus of claim 45, wherein at least part of the first abstraction level circuit design is at a register transfer level of abstraction.

48. The apparatus of claim 45, wherein the first abstraction level circuit design is at least as abstract as a register transfer level of abstraction.

49. The apparatus of claim 45, wherein at least part of the second abstraction level circuit design is at a logic level of abstraction.

50. The apparatus of claim 45, wherein at least part of the second abstraction level circuit design is at a transistor level of abstraction.

51. The apparatus of claim 45, wherein the second abstraction level circuit design is no more abstract than a register logic level of abstraction.

52. The apparatus of claim 45, further comprising:

means for performing verification of the first abstraction level circuit design of the one or more memories with at least one of the one or more simulation models of the one or more memories.

53. The apparatus of claim 52, wherein said means for performing verification includes a hardware description language simulator.

54. The apparatus of claim 52, wherein said means for performing verification performs at least formal verification.

55. The apparatus of claim 45, further comprising:

means for performing verification of the second abstraction level circuit design of the one or more memories with at least one of the one or more structural models of the one or more memories.

56. The apparatus of claim 55, wherein said means for performing verification of the second abstraction level circuit design performs verification of the second abstraction level circuit design of the one or more memories with at least one of the one or more structural models of the one or more memories, at least partly with state point mapping between the second abstraction level circuit design of the one or more memories and the at least one of the one or more structural models of the one or more memories.

57. The apparatus of claim 45, wherein each parameterized memory model of the one or more parameterized memory models at least partly models one or more memory primitives.

58. The apparatus of claim 57, wherein at least one of the one or more primitives modeled by at least one of the one or more parameterized memory models includes one or more of: content addressable memories, single read port memories, multi read port memories, single write port memories, multi write port memories.

59. The apparatus of claim 57, wherein at least one of the one or more memory primitives modeled by the one or more parameterized memory models is described by one or more parameters.

60. The apparatus of claim 59, wherein at least one of the one or more parameters at least partly defines: a number of addressable locations, an amount of memory in each of the addressable locations, column multiplexing ratio for a number of physical columns per bit of data, bitline organization, write-driver behavior, set signal, reset signal, detection of write collision, and memory behavior when one or more inputs are ternary value X.

61. The apparatus of claim 45, wherein at least one of the one or more simulation models includes at least hardware description language description.

62. The apparatus of claim 45, wherein at least one of the one or more simulation models handles address collisions for simultaneous writes to a same address at different ports.

63. The apparatus of claim 45, wherein at least one of the one or more simulation models handles the X ternary value at primary inputs.

64. The apparatus of claim 45, wherein the creation of at least one of the one or more simulation models results in the creation of hardware description language source text for the corresponding memory.

65. The apparatus of claim 45, wherein at least one of the one or more structural models includes a hierarchical data structure representing design hierarchy and logic details of design modules in the design hierarchy.

66. The apparatus of claim 45, wherein at least one of the one or more structural models includes hardware description language source text for synthesis into a logic netlist for equivalence checking.

* * * * *